United States Patent [19]

Capson et al.

[11] Patent Number: 4,941,256
[45] Date of Patent: Jul. 17, 1990

[54] AUTOMATIC VISUAL MEASUREMENT OF SURFACE MOUNT DEVICE PLACEMENT

[75] Inventors: David W. Capson, Hamilton, Canada; Randy Tsang, Kowloon, Hong Kong

[73] Assignee: Canadian Patents & Development Ltd., Ottawa, Canada

[21] Appl. No.: 381,790

[22] Filed: Jul. 19, 1989

[30] Foreign Application Priority Data

Aug. 19, 1988 [CA] Canada ................................. 575895

[51] Int. Cl.⁵ .............................................. H05K 3/30
[52] U.S. Cl. ......................................... 29/833; 29/840; 219/10.41; 219/10.43; 219/10.57; 219/10.65; 228/103; 228/105; 228/179; 358/101
[58] Field of Search ................ 29/833, 721, 759, 840; 228/103, 105, 179; 219/10.41, 10.43, 10.57, 10.65, 10.67, 10.79; 356/375; 358/101, 105

[56] References Cited

U.S. PATENT DOCUMENTS

| | | | |
|---|---|---|---|
| 4,457,467 | 7/1984 | Klement et al. | 228/103 |
| 4,494,139 | 1/1985 | Shima et al. | 358/101 |
| 4,671,446 | 6/1987 | Sherman | 228/179 X |
| 4,737,845 | 4/1988 | Susuki et al. | 358/101 |
| 4,867,569 | 9/1989 | Mohara | 29/759 X |

FOREIGN PATENT DOCUMENTS 52-37768 3/1977 Japan ..................................... 29/833
59-107202 6/1984 Japan ..................................... 29/833

OTHER PUBLICATIONS

IBM Tech Discl Bull, vol. 22, No. 9, Feb. 1980, by T. Ross et al, p. 4068.
IBM Tech Discl Bull, vol. 27, No. 6, Nov. 1984, by M. S. Chester et al, pp. 3653-3655.
IBM Tech Discl Bull, vol. 30, No. 7, Dec. 1987, pp. 381-382.

Primary Examiner—Carl E. Hall
Assistant Examiner—Carl J. Arbes
Attorney, Agent, or Firm—Harold A. Kelly

[57] ABSTRACT

A method for inspecting the placement and alignment of surface mounted components on printed circuit boards during assembly. After the component is placed on the board, an infrared camera provides an image of leads on the component and corresponding soldering pads, to which the leads are to be soldered, on the board in a single exposure. The image is then processed by a computer and the position and orientations of the leads of the component with respect to the soldering pads are determined. As a result, any unsatisfactory misalignment of the component can be detected and defective printed circuit boards identified.

20 Claims, 2 Drawing Sheets

AUTOMATIC VISUAL MEASUREMENT OF SURFACE MOUNT DEVICE PLACEMENT

FIELD OF THE INVENTION

The present invention is directed to a method and system for inspecting the placement and alignment of surface mounted components on printed circuit boards, especially in fast assembly lines where a large number of defective boards may be produced before a problem is detected. Normal visual inspection is unsuitable due to the small size and close spacing of the surface mounted components and the speed with which the inspection must be done on assembly lines. A more suitable system is provided by using a TV camera to capture an image of the surface mounted components on a printed circuit board which image is processed by a computer to determine the orientation and location of the components on the board.

BACKGROUND OF THE INVENTION

U.S. Pat. Nos. 4,473,842 and 4,549,206 describe types of apparatus for examining if a miniaturized electronic part is correctly mounted in a predetermined position on a printed circuit board using an image sensor to examine the printed circuit board. However, the apparatus in both of these U.S. patents can only be used with a circuit board having some degree of transparency since the illuminating means is located on one side of the board and the image sensor on the other side of the board. The images sensor provides an image which is compared with a stored reference pattern. However, one advantage of surface mount technology at present is the capability to use multi-layer boards. These multi-layer boards are not transparent. Therefore, the systems shown in U.S. Pat. Nos. 4,473,842 and 4,549,206 are not suitable for the present technology used in assembling surface mount components on printed circuit boards.

U.S. Pat. No. 4,677,473 describes a soldering inspection system for circuit components such as a component chips and the like which are soldered to a circuit board. This patent describes a system which utilizes a plurality of light sources and TV cameras to provide images of the solder connections from different angles and means to process the image information obtained. However, the system inspects the soldered connections after the components are mounted on and soldered to a printed circuit board and not the position of the components before they are firmly attached to the circuit boards.

Traditionally electronic components such as integrated circuits are mounted on printed circuit boards by inserting terminals of the components through holes in the printed circuit board. However, the electronics industry has recently been adapting to Surface Mount Technology wherein the components are devices mounted only on the surface of printed circuit boards. An automatic pick-and-place mechanism is used to place these type of components onto a printed circuit board and then the whole printed circuit board undergoes a reflow soldering process to solder the leads of the components firmly onto pads on the board. However, it is much more difficult to properly position the electronic components on a printed circuit board when terminals of the components are not inserted through openings in the board.

Surface mount components must be accurately placed on the printed circuit board since they typically have a large number of leads (18-84) and are often packed very close to each other on the board. Small misalignments of surface mount components can result in soldering defects such as bridging causing a short circuit or poor connections between the leads and pads. Other defects which can occur are caused by insufficient solder, excess solder, poor wetting etc. These soldering defects are not always detectable in electrical function tests since they can lead to failure after a printed circuit board is in service where it is subjected to heat or mechanical stress. For these reasons, manufacturers of printed circuit boards have very tight tolerances with regard to the positioning and alignment of surface mount components on the board. The automatic pick-and-place mechanisms can have accumulating errors in repeatability which, after some time, can lead to inaccurate placement of the components. Therefore, it is very important to inspect the placement of the surface mount components on the printed circuit board during the manufacturing process.

One method of determining the position of components on a printed board is described by M. G. Buffa in "Process Control For Automated Component Assembly of Surface Mounted Devices Utilizing a Machine Controller", Society of Manufacturing Engineers (SME), Vision 85 Conference Proceedings, March 1985, pages 5-180 to 5-200. In this method, the positions of the soldering pads are located on an empty printed circuit board and after the components are loaded onto the board, the positions of the components are compared to the previously obtained solder pad locations. However, the solder pads and component leads positions are not obtained at the same time and, as a result, the system is prone to inaccuracies which may be introduced by movement of the printed circuit board.

Another method of determining the position of components is described by N. S. Chang in "SMV - A Computer Vision Program For Loading Surface Mount Components", Proceedings of the SPIE, Vol. 557, 1986, pages 76 to 80. In this method, a vision system is used to determine the orientation and location of a component prior to placing it on a printed circuit board. No inspection is done after the component is loaded onto the board.

SUMMARY OF THE INVENTION

An object of the present invention is to provide an automatic inspection system for determining the positions and orientation of surface mount components on a printed circuit board.

According to the present invention, the positions of surface mount components on printed circuit boards are inspected by an image sensing camera prior to or after soldering the components leads to soldering pads on the printed circuit board. The image sensing camera provides, in the same exposure, an image of the leads of the components as well as an image of the soldering pads on the printed circuit board. This image is then processed by a computer to determine the orientation and location of the components relative to the locations of the solder pads.

An advantage of this method is that it is insensitive to inaccuracies contributed by possible movement of the camera or printed circuit board since images of both the leads of the components and the soldering pads are obtained at the same time. Therefore, lower cost mechanisms can be used for positioning the components. The positions and orientatations of the components can be accurately determined even if the soldering pads are slightly out of place due to board warpage or other deformation.

Another advantage of an automatic inspection system is the capability to gather "on-line" statistics from the computer so as to monitor the operation on an on-going basis.

Other objects, advantages and features of the invention will become more apparent from the following description of the preferred embodiments taken in conjunction with the accompanying drawings.

BRIEF DESCRIPTION OF THE DRAWINGS

FIG. 6(a) shows a computer processed image for 2 adjacent sides of a component while

DESCRIPTION OF THE INVENTION

Figure 1:
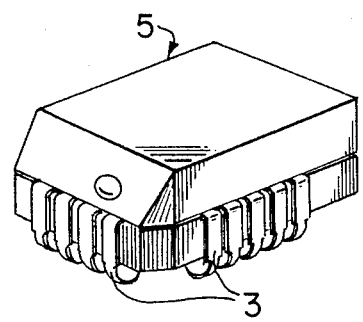
FIG. 1 shows a typical surface mount component with an 18 lead Plastic Leaded Chip Carrier (PLCC) package.
Figure 3:
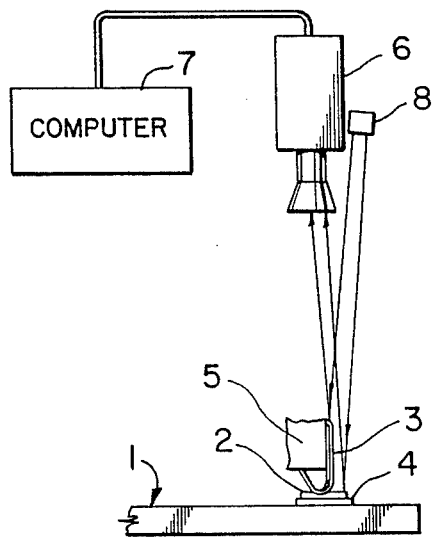
FIG. 3 shows a system according to the present invention in which a component lead on a solder pad covered with solder paste is shown in cross section.

The body of the chip shown in FIG. 1 is usually dark in colour which makes the shiny leads distinctively identifiable. A portion of this chip 5 and one of the leads 3 is shown in cross-section in FIG. 3 with the lead 3 sitting in solder paste 2 on solder pad 4. The printed circuit board 1 is illuminated from a high angle with an infrared source 8 and due to the reflective nature of the metal lead 3 and the solder paste, bright spots are created in an image formed by an infrared-sensitive camera 6 at locations corresponding to the positions of the leads and solder pads. To reduce reflection from the printed circuit board substrate 1, which is usually green in colour, or from the component itself and problems caused by ambient stray light, infrared light is preferred for illuminating the board and by using an appropriate threshold, the bright objects can be easily separated from the darker background in this type of image. Methods for choosing the threshold are well known to those familiar with the art.

Figure 4:
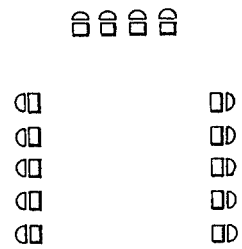
FIG. 4 shows a computer processed image obtained from the system.
Figure 6A:
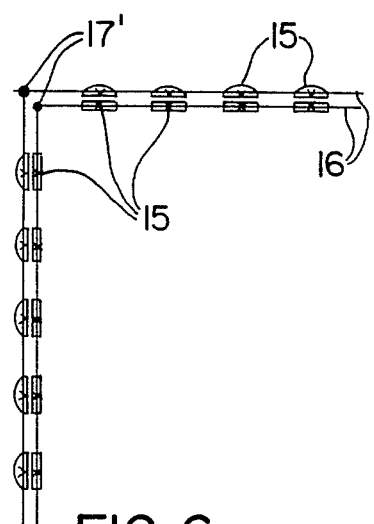

The image produced by the infrared sensitive camera 6 is processed in a computer 7. The resulting processed image is illustrated in FIG. 4. The identity of each object in this image can be easily determined as the objects on the outside are solder pads while those on the inside are the leads of the component. The centroid 15 is then determined for each object in the image and best fit lines are fitted through the centroids of the rows of leads and pads as shown in FIG. 6(a). Methods of fitting lines through points are well known by those familiar with the art. The orientation and location of the component relative to the solder pads can then be calculated from the relative position of the lines. Any displacement of a component relative to the solder pads can then be determined and corrected before leads of the component are soldered to the solder pads. In this manner, improperly soldered leads are avoided. Similarly, after the leads are soldered to the pads, an improperly positioned component can be detected and defective boards identified.

A "best" fit line through a set of points, such as the centroids may be defined as the line which minimizes the square of the perpendicular distances from the points to the line. However, this definition involves some very time consuming calculations to obtain the best fit line. A simpler procedure for lines which are more or less horizontally oriented is to define the best fit line as one which minimizes the square of the vertical distances from the points to the lines. To avoid dealing with large slopes, the Xc and Yc coordinates are interchanged for objects which are more or less vertically orientated.

Figure 2:
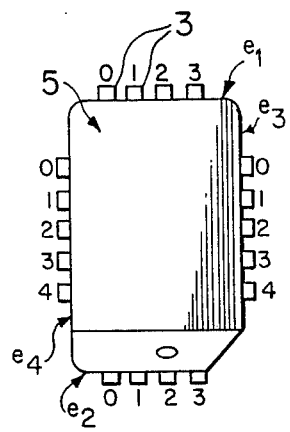
FIG. 2 shows a top view of a component with pins numbers being assigned to leads of the component.

The objects in the processed image are classified for calculation purposes into two groups; (1) lead objects and (2) pad objects. Those objects on the outside of the image are solder pads while those on the inside are leads of the component. Referring to the top rows of objects shown in FIG. 4 or 6(a), these objects can be classified according to the Y coordinate (Yc) of their centroids 15 by computing a threshold Yt using a procedure similar to the one used to find the grey level threshold. Objects with Yc's less than Yt in the top rows are then lead objects while those with larger Yc's are pad objects. Objects in the image which are located in vertical columns are classified in the same manner according to their X coordinate (Xc) of their centroid 15. The leads and pads of a component are also assigned pin numbers that increase from left to right or from top to bottom and the four sides of component 5 are labelled $e_1$ to $e_4$, as shown in FIG. 2. The positions of the leads along the best fit lines can be roughly estimated for a horizontal row of leads on a side $e_1$ as indicated by the numbers 12 in FIG. 5 or 6b. This estimation depends on the type of devices and if they have rows of leads on all sides or only on two sides. Objects closest to a particular estimated position 12 are grouped together while objects 13 in FIG. 5 which are too far away are excluded. In addition, objects with very small areas are ignored in order to remove noise.

Figure 5:
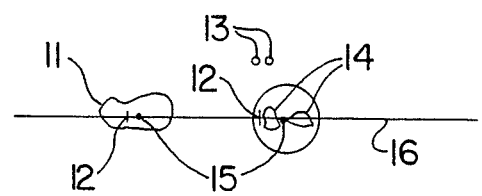
FIG. 5 shows the type of objects which can appear in an image.

Each group of objects in the image corresponding to one of the leads normally contains only one object 11 as shown in FIG. 5. However, a lead might provide several closely spaced lead objects 14 in the image depending on the grey level threshold and lighting conditions. The centroid 15 of a number of closely spaced objects 14 can also be determined and the resulting centroid 15 of all these objects is then considered as the centroid for that particular lead.

This procedure is also applied to the solder pad images to determine their centroids. Leads and pads having the same pin number are then paired to ensure that only objects which are most likely to be leads and pads in the image will be used for further processing. Each pair then contains three items (1) the centroid of the lead, (2) the centroid of the pad, and (3) the pin number of lead and pad.

Figure 6B:
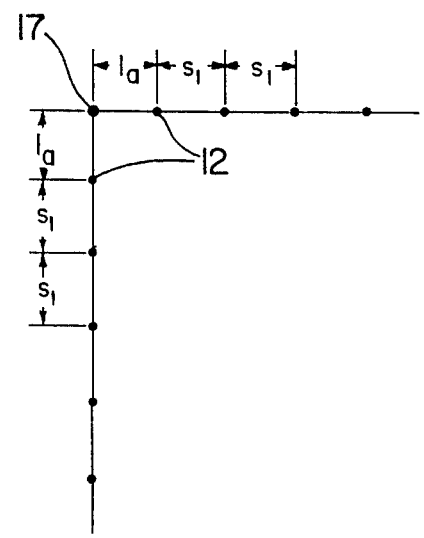
FIG. 6(b) illustrates a method of estimating lead positions for a component.

For devices with four rows of leads, a row on each side of the component, two adjacent sides of a component may be considered together in the calculations for the best fit lines and estimated lead positions. The coordinates of the intersection 17 of lines through points of estimated lead positions 12 for adjacent sides can be determined for any specific device as shown in FIG. 6(b) The distance ($1_a$) from the point of intersection 17 to the first lead and the separation of the leads ($S_1$) are fixed for any one particular device. Therefore, positions of the leads along a best fit line 16 can be easily estimated as illustrated in FIG. 6(a) and (b). The coordinates for the intersections of the best fit lines 16 for rows of leads and pads are indicated by the number 17' in FIG. 6(a). This procedure gives a good estimate of the lead or pad positions even when a number of lead or pad objects are missing in the processed image. Any missing objects of the original image will then not affect the ability of the computer to determine the position and orientation of a component.

For devices with only two rows of leads, such as gull wing leaded devices, no line intersection can be determined since these devices do not have leads on adjacent sides. However, these type of devices have leads and pads which usually produce larger objects in the image due to their larger areas. Therefore, the object with a significant area and closest to the corner can be used as the estimated position for the first pin number. The estimated position for other pin numbers then follows at multiples of ($S_1$) along the best fit lines.

The mean centroid of a row of lead or pad objects have coordinates Xmc and Ymc and the orientation of a component with respect to the pads can then be determined using information from two opposite sides, such as $e_1$ and $e_2$ in FIG. 2. This can be accomplished by determining the length and orientation of a line $L_1$ joining the two mean centroids for the rows of lead objects on sides $e_1$ and $e_2$. The angle $\theta_r$ that $L_1$ makes with the horizontal can then be determined and the orientation of the component with respect to the solder pad is then:

$$\beta = \theta_p - \theta_r$$

where $\theta_p$ is the angle that a line Lp makes with the horizontal, the line Lp joining the mean centroids for the two corresponding rows of pads next to $e_1$ and $e_2$. If a component is perfectly aligned with respect to the corresponding pads, then the angles $\theta_p$ and $\theta_r$ will be equal.

Once the orientation angle $\beta$ is obtained, the location of the center coordinate (Xcc, Ycc) for the component can be determined and compared with the coordinates (Xpc, Ypc) of the center of the area surrounded by the solder pads for that component.

The position of the center of the component and its orientation determine if the placement of the component with respect to the soldering pads is acceptable. The lead of the component with the greatest displacement from its corresponding solder pad is always one at the end of a row or column of soldering pads. The component has been placed in an acceptable position if this greatest displacement is within a predetermined allowable maximum. However, if the greatest displacement is larger than an allowable maximum, a signal is generated to indicate that the position of the component is unacceptable.

A correctly placed, or only slightly misplaced component will leave the solder pads on all sides of the component visible to the camera. A component that is seriously misplaced may, however, cover some of the pads so that solder pads may be visible on only two adjacent sides. In this case, the orientation cannot be determined from two opposite sides but can be determined from two adjacent sides. When a component is so seriously misplaced that part of a component lies outside the inspection window of the camera, a warning for critical misplacement is generated.

For small devices, the leads and pads on all four sides of a component can be captured in one image. However, larger components may require a number of images, for instance four, in order to provide an image of all the leads or pads.

Various modification of the preferred embodiments of the invention can be carried out without departing from the scope of the present invention which is determined in accordance with the appended claims.

We claim:

1. A method of determining the position and orientation of a surface mount component on a printed circuit board comprising:
   (a) placing said component on said board at a required location,
   (b) illuminating said board with a radiation source so that radiation from the source is reflected by leads of said component and corresponding solder pads on the board to an image sensor,
   (c) obtaining an image from the reflected radiation in a single exposure by the image sensor,
   (d) processing the image by a computer to provide a processed image with objects in this processed image corresponding to the positions of the leads and pads on the board, and
   (e) determining the actual position and orientation of the component's leads with respect to the position and orientation of the pads on the board from the processed image with the computer which then determines if the position of the leads compared to the positions of the pads are within predetermined limits.

2. A method as defined in claim 1, wherein the radiation source illuminates said board with infrared light and said image sensor is an infrared sensitive camera.

3. A method as defined in claim 2, wherein the radiation source directs radiation onto the board from a high angle.

4. A method as defined in claim 1, wherein a threshold value for background radiation in the image from the image sensor is determined and luminosity values in this image which are below said threshold value are removed by the computer during processing of the image.

5. A method as defined in claim 2, wherein a threshold value for background radiation in the image from the image sensor is determined and luminosity values in this image which are below said threshold value are removed by the computer during processing of the image.

6. A method as defined in claim 3, wherein a threshold value for background radiation in the image from the image sensor is determined and luminosity values in this image which are below said threshold value are removed by the computer during processing of the image.

7. A method as defined in claim 1, wherein centroids of objects in the processed image are determined and best fit lines are positioned in the image for these centroids by the computer.

8. A method as defined in claim 2, wherein centroids of objects in the processed image are determined and best fit lines are positioned in the image for these centroids by the computer.

9. A method as defined in claim 3, wherein centroids of objects in the processed image are determined and best fit lines are positioned in the image for these centroids by the computer.

10. A method as defined in claim 1, wherein a threshold value for background radiation in the image from the image sensor is determined and luminosity values in this image which are below said threshold are removed by the computer during processing of the image, centroids of objects in the processed image are then determined with best fit lines being positioned in the image for these centroids and objects in the image which are located beyond a predetermined distance from these best fit lines being removed from the image during processing.

11. A method as defined in claim 2, wherein a threshold value for background radiation in the image from the image sensor is determined and luminosity values in this image which are below said threshold are removed by the computer during processing of the image, centroids of objects in the processed image are then determined with best fit lines being positioned in the image for these centroids and objects in the image which are located beyond a predetermined distance from these best fit lines being removed from the image during processing.

12. A method as defined in claim 3, wherein a threshold value for background radiation in the image from the image sensor is determined and luminosity values in this image which are below said threshold are removed by the computer during processing of the image, centroids of objects in the processed image are then determined with best fit lines being positioned in the image for these centroids and objects in the image which are located beyond a predetermined distance from these best fit lines being removed from the image during processing.

13. A method as defined in claim 1, wherein centroids of objects in the processed image are determined and best fit lines are positioned in the image for these centroids, these best fit lines corresponding to the position and orientation of rows of leads and pads on the printed circuit board, the best fit lines which correspond to a row of leads being identified and differentiated from the best fit lines which correspond to a row of pads.

14. A method as defined in claim 2, wherein centroids of objects in the processed image are determined and best fit lines are positioned in the image for these centroids, these best fit lines corresponding to the position and orientation of rows of leads and pads on the printed circuit board, the best fit lines which correspond to a row of leads being identified and differentiated from the best fit lines which correspond to a row of pads.

15. A method as defined in claim 3, wherein centroids of objects in the processed image are determined and best fit lines are positioned in the image for these centroids, these best fit lines corresponding to the position and orientation of rows of leads and pads on the printed circuit board, the best fit lines which correspond to a row of leads being identified and differentiated from the best fit lines which correspond to a row of pads.

16. A method as defined in claim 1, wherein centroids of objects in the processed image are determined and best fit lines are positioned in the image for these centroids, these best fit lines corresponding to the position and orientation of rows of leads and pads on the printed circuit board, the best fit lines corresponding to a row of leads being identified and differentiated from the best fit lines which correspond to a row of pads, the position and orientation of the leads with respect to the position and orientation of pads on the printed circuit being determined by the computer from the position and orientation of best fit lines in the processed image.

17. A method as defined in claim 2, wherein centroids of objects in the processed image are determined and best fit lines are positioned in the image for these centroids, these best fit lines corresponding to the position and orientation of rows of leads and pads on the printed circuit board, the best fit lines corresponding to a row of leads being identified and differentiated from the best fit lines which correspond to a row of pads, the position and orientation of the leads with respect to the position and orientation of pads on the printed circuit being determined by the computer from the position and orientation of best fit lines in the processed image.

18. A method as defined in claim 3, wherein centroids of objects in the processed image are determined and best fit lines are positioned in the image for these centroids, these best fit lines corresponding to the position and orientation of rows of leads and pads on the printed circuit board, the best fit lines corresponding to a row of leads being identified and differentiated from the best fit lines which correspond to a row of pads, the position and orientation of the leads with respect to the position and orientation of pads on the printed circuit being determined by the computer from the position and orientation of best fit lines in the processed image.

19. A method as defined in claim 1, wherein the image is obtained prior to said leads being soldered to said pads.

20. A method as defined in claim 1, wherein the image is obtained after said leads are soldered to said pads.

* * * * *